United States Patent
Veneklasen et al.

(10) Patent No.: US 6,515,282 B1
(45) Date of Patent: Feb. 4, 2003

(54) TESTING OF INTERCONNECTION CIRCUITRY USING TWO MODULATED CHARGED PARTICLE BEAMS

(75) Inventors: Lee H. Veneklasen, Castro Valley, CA (US); Juan Maldonado, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/537,915

(22) Filed: Mar. 28, 2000

(51) Int. Cl.[7] .................. G01R 31/26; H01J 37/09; H01J 37/00
(52) U.S. Cl. ............... 250/310; 250/305; 250/306; 250/311
(58) Field of Search ................ 250/305, 306, 250/310, 311, 492.1, 492.2; 374/158 R, 158 T, 158 D (56) References Cited

U.S. PATENT DOCUMENTS

| | | | | |
|---|---|---|---|---|
| 4,420,686 A | * | 12/1983 | Onoguchi et al. | 250/310 |
| 4,851,768 A | * | 7/1989 | Yoshizawa et al. | 324/158 |
| 5,029,249 A | * | 7/1991 | Ohtaka | 250/306 |
| 5,430,292 A | * | 7/1995 | Honjo et al. | 250/310 |
| 5,436,449 A | * | 7/1995 | Takahashi et al. | 250/311 |
| 5,448,064 A | * | 9/1995 | Matsuyama | 250/310 |
| 5,557,105 A | * | 9/1996 | Honjo et al. | 250/310 |

* cited by examiner

*Primary Examiner*—John R. Lee
*Assistant Examiner*—David A. Vanore
(74) *Attorney, Agent, or Firm*—Jung-hua Kuo (57) ABSTRACT

Apparatus and a method for non-contact electrical testing of printed circuit boards, solid state display devices, integrated circuits and other substrates with traces that connect together components of a circuit, using two modulated charged particle beams. The apparatus includes two sources of beams, electrodes to modulate the beams, optics to focus the beams and deflection coils to deflect the beams over a large area. The apparatus also has an enclosure around the optics and the deflection coils of magnetically soft material. A surrounding solenoid excitation coil creates an almost uniform axial magnetic field within the magnetic enclosure. A detection system for detecting the voltage contrast signals, including suitable signal processing system is also provided. The use of two beams simultaneously allows fast, direct measurement of impedance parameters. By selecting appropriate beam modulation frequencies, the sensitivity to a certain kind of defect can be selectively increased. The use of modulated beams and frequency filtering of the voltage contrast signals allows such measurement to be quantitative, more sensitive and more discriminating between various possible defects in the interconnection network then the prior art methods.

26 Claims, 4 Drawing Sheets

TESTING OF INTERCONNECTION CIRCUITRY USING TWO MODULATED CHARGED PARTICLE BEAMS

FIELD OF THE INVENTION

This disclosure relates to non-contact electrical testing of printed circuit boards, solid state display devices, integrated circuits and other substrates carrying traces that connect together components of a circuit.

DESCRIPTION OF THE PRIOR ART

The goal of such non-contact testing is to find excessively low leakage resistance between different interconnection traces, between any one trace and the ground plane, and excessively high resistance along an individual trace. It is desirable to find circuit malfunctions caused by interconnection defects early in the electronic manufacturing process to minimize the cost of repairs and to maximize the yield.

Conventional network prober systems inject alternating current (hereinafter AC) or direct current (hereinafter DC) into the device under test (DUT). Conventional capacitively coupled probers can inject only alternating current. However, both techniques must necessarily make mechanical contact between test probes and at least two points in the DUT in order to establish a flow of current. The small size and high density of present day interconnection elements make it difficult to make reliable contact in all circumstances, and the physical contact may damage the DUT. As interconnect traces become smaller and more densely packed, the test cycle for an entire DUT becomes very long because testing of each point requires mechanical motions of the test probe(s). Thus faster, non-contacting methods are needed to economically test more advanced DUTs.

Known voltage contrast methods for such testing use light or particle beams that may be focused and scanned very quickly from test point to test point, thus reducing the total time required to inspect a circuit. These methods induce current signals by illuminating the test point with light, electron or ion beams. These test systems scan the beam very rapidly from test point to test point using optical, electrostatic or magnetic deflection. Most of the beam energy incident on a test point is absorbed, causing the circuitry to charge negatively where the beam is an electron beam. Secondary electrons are ejected from the DUT surface, and are detected to measure the voltage of the DUT surface as it charges. The difference between absorption and secondary emission current determines the net rate at which the DUT surface charges. Secondary electrons leave the surface with low average energy, and gain or lose additional energy depending upon the potential of the test point DUT surface with respect to its surroundings. An electron leaving a negatively charged area gains more energy than one leaving a positive area because negative charge repels electrons. A detector which measures current depends upon energy as well as number of secondary electrons can detect surface potential at the point illuminated by the beam. The prior art is replete with such techniques using a beam to test for electrical properties of interconnection network elements in a DUT.

U.S. Pat. No. 4,417,203 relates to non-contact testing of three dimensional networks of conductors embedded in dielectric material. The system described uses two beams; a flood beam and a focus probe beam. The flood beam applies a negative charge to either the top or the bottom surface of the specimen and then the probe beam scans the network generating secondary electron emission, which subsequently is processed by filtering and digitizing. U.S. Pat. No. 4,843,330 also shows a system that uses two beams, a flood beam and a focus probe beam. In addition it also illustrates the use of a biasing grid to enhance the detected voltage contrast.

Another prior art electron beam tester, see U.S. Pat. No. 5,834,773, uses one beam in combination with deflection plates that direct electrons from the substrate onto a smaller but similarly biased detector. The secondary electrons are steered into the detector by low voltage deflection plates driven in synchronization with beam position. This arrangement makes it possible to observe widely spaced test points, and also allows the use of a solid state or electron multiplier pre-amplifier to minimize detection noise.

One form of prior art voltage contrast detector places a biased grid above the substrate, so that only electrons with energy above a certain threshold may pass through and reach a second more positively biased collector. The grid may also be enclosed in a low bandwidth servo loop that varies grid voltage to maintain constant detected current. Using this method, the grid voltage instead of the detected current records the surface potential. However, detectors with a grid next to the substrate are not advantageous for wide field electron beam testers because it can occlude the beam.

Prior art systems also use two beams to test one side of a substrate in a serial manner, one beam performing a test while the other is being deflected to a new test site. This method reduces the time lost to deflection overhead, but does not employ two beams to simultaneously observe interconnected test points. Using only one beam, direct measurement of impedance between two test point is not possible, but such methods can detect leakage resistance of 200 Mohm or less and series resistance under 2 Mohm. A much lower threshold for measuring series resistance is desirable. It is also desirable to be able to better discriminate, than in the prior art methods, between the various possible defects in the interconnection network. A test time shorter than the prior art method is desirable to reduce the cost of testing.

SUMMARY

The present disclosure relates to an apparatus and a method of non-contact electrical testing of printed circuit boards, solid state display devices, integrated circuits and other DUTs having traces that connect together components of a circuit, using two modulated charged particle beams in a uniform axial magnetic field environment.

The apparatus includes two charged particle sources each generating one beam, electrodes to modulate the beams, optics to focus the beams and deflection coils to deflect the beams over a large area. The apparatus has an enclosure for the optics and the deflection coils. The enclosure is made of magnetically soft material. A solenoid excitation coil creates an almost uniform axial magnetic field within the magnetic enclosure. A detection system for detecting the voltage contrast signals, including the signal processing system is also included.

The uniform magnetic field results in reduced axial aberration, deflection aberration and spot growth in the beams, this in turn results in the optics providing higher beam current from a source of given brightness.

The associated method using two beams allows a fast, direct measurement of impedance parameters of an interconnection network on a DUT. The use of modulated beams and frequency filtering of the voltage contrast signals allows such measurement to be quantitative, more sensitive and more discriminating between various possible defects in the interconnection network then the prior art methods. By selecting appropriate beam modulation frequencies the sensitivity to a certain kind of defect is selectively increased, and by combining DC measurement techniques with the present AC method the range of measurement of leakage is improved. In particular, a lower threshold for measuring series resistance is achieved by the present invention.

Further features and advantages will appear more clearly on a reading of the detailed description, which is given below by way of example only and with reference to the accompanying drawings.

DETAILED DESCRIPTION

Apparatus

Figure 1:
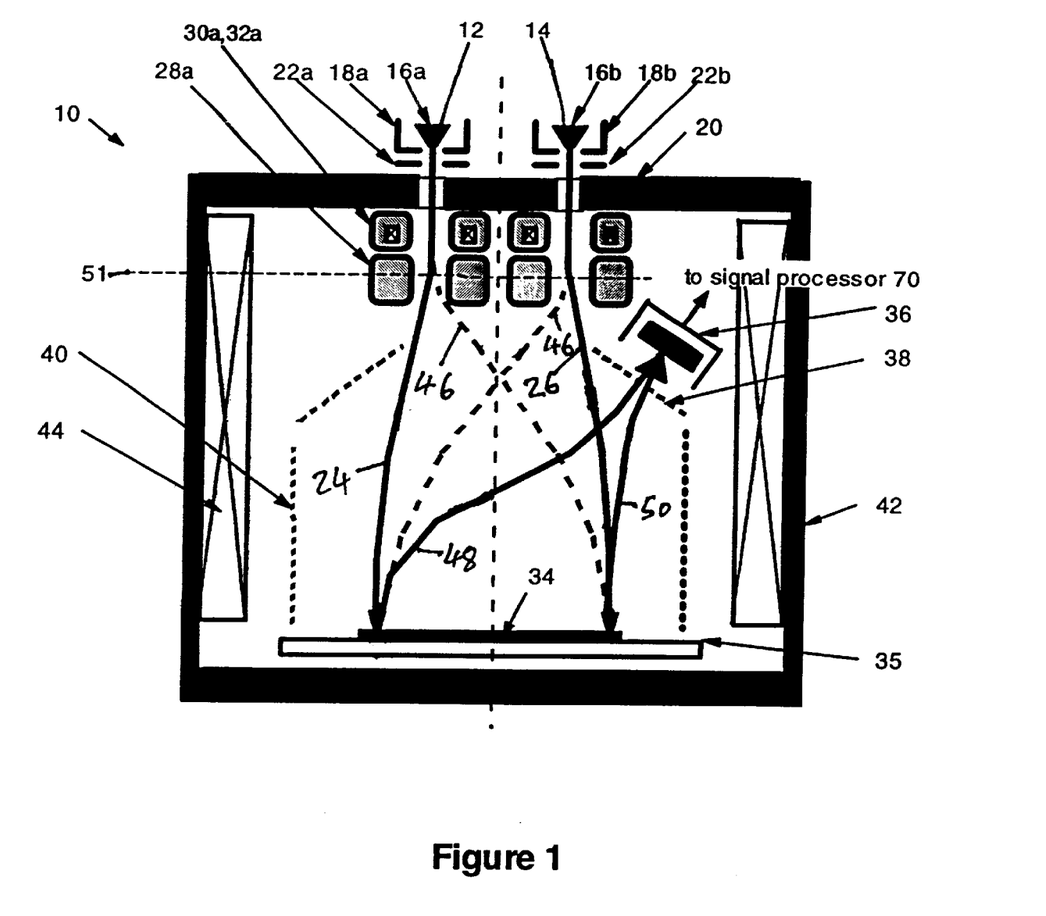
FIG. 1 illustrates an apparatus in accordance with this disclosure.

FIG. 1 illustrates in a side cross sectional view a non-contact testing apparatus 10 with two charged particle beams and distributed axis optics. Apparatus 10 has two conventional electron guns (sources) 12 and 14 illustrated schematically. The guns 12 and 14 are spaced as close together as possible. Each gun 12 and 14 conventionally contains a cathode 16a and 16b, a negatively biased suppressor electrode 18a and 18b and an anode 20. Each gun 12 and 14 also has an additional control electrode 22a and 22b respectively that allows the current of each beam to be turned on or off or otherwise modulated in intensity at a selected frequency. The electrical leads, control leads, coating apparatus, and mounting structure are not shown in FIG. 1 for clarity.

Beams 24 and 26 are independently deflected by deflection coils 28a and 28b respectively. The deflection coils 28a and 28b are conventional saddle deflection coils or alternatively toroid deflection coils. Adjacent to the deflection coils 28a and 28b are conventional dynamic focus coils 30a and 30b and octopole stigmation coils 32a and 32b for wide field deflection. This arrangement deflects the beams over a large overlapping area on the DUT 34 measuring about 100–200 mm square. The interconnection network to be tested is rested on Table 35 in the area that can be exposed to at least one of the deflected beams 24 and 26. The diameter of the beams 24 and 26 at the DUT 34 is typically 25–50 μm and the angular divergence in the beam is 1–5 mrad.

The system includes a planar detector 36, typically a conventional solid state diode detector element that amplifies the detected current before conventional signal processing, a detector mesh 38, and control plates 40 to deflect secondary electrons from one or both beams 24 and 26 toward the detector mesh 38. Mesh 38 is biased so that only electrons with a sufficiently high energy pass through it to reach the detector. The bias voltages applied to the plates 40 are such as to steer secondary electrons toward the detector 36 opening. The detector system is suitable for observing a large field. However, if the test points on DUT 34 are far apart, signals from only one of the two illuminated test points may be observed with a given control plate adjustment.

The beams 24 and 26, typically of energy 10–12 KeV, are deflected and focused after they emerge from the guns 12 and 14 respectively. The system for deflecting and focusing beams 24 and 26 is placed below guns 12 and 14 and housed a conventional cylindrical enclosure 42 constructed of magnetically soft material and used as the flux return path for a solenoid magnetic lens. A solenoid excitation coil 44 inside the enclosure 42 creates an almost uniform axial magnetic field.

Within the uniform magnetic field, the beam electrons spiral about axes determined by where they entered the magnetic field. Each undeflected beam 24 or 26 is focused with one to one magnification at the corresponding point on the interconnection network on DUT 34. When beam 24 or 26 is deflected off its axis, it moves along a helical path, striking the interconnection network 34 at a point whose distance from the original axis is proportional to deflection drive. The separate deflection coil 28 elements are located approximately at the back focal plane 51 of the focusing optics, so that beams 24 and 26 have maximum radial deflection. Since beams 24 and 26 each follow a helical path, they tilt in the azimuthal direction with respect to the system axis. The dotted lines 46 show the range of beam deflection envisioned for a large field system. The region where beam deflection fields overlap may be inspected by using both of the beams 24 and 26. The centerless solenoid lens field reduces axial aberrations that increase the probe size, and deflection aberrations that cause additional spot growth. The deflection field distortion is particularly low, making possible a large deflection field.

The paths of secondary electrons in beams 48, 50 are different from those in a prior art system with nonuniform magnetic field. The uniform magnetic field deflects secondary electrons perpendicular to their direction of motion, but does not change their energy. Electrons leave the DUT 34 surface at a typical angle of 1 radian, and follow helical paths of about 10 mm pitch. As they are deflected sideways toward the detector 36 under the action of deflectors 40, they gain energy and follow cycloid paths. The axial magnetic field confines the secondary electrons to a smaller bundle, which directs them to the detector grid 38. Thus the uniform field is advantageous from the viewpoint of deflection efficiency as well as field size and beam current.

In the disclosed system, an adequate signal to noise ratio is attained using an exposure time of 100 μsec per measurement and four measurements to calculate series resistance. DC measurements may be made in less than 10 μsec using an additional discharge period of 100 μsec. Under these conditions, a measurement cycle may be completed in about 600 μsec, including an "overhead period" of 100 μsec for the beam deflections and detector deflection adjustments. Since intertrace resistance measurements only require one transimpedance measurement at one frequency, they may be completed in about 125 μsec. This measurement rate is faster than present rates of about one msec/cycle for conventional systems, even though advantageously it uses about ⅟15 the current used in conventional systems.

The above method, and the apparatus for implementing the above method, is described in further detail hereinafter.

Figure 2:
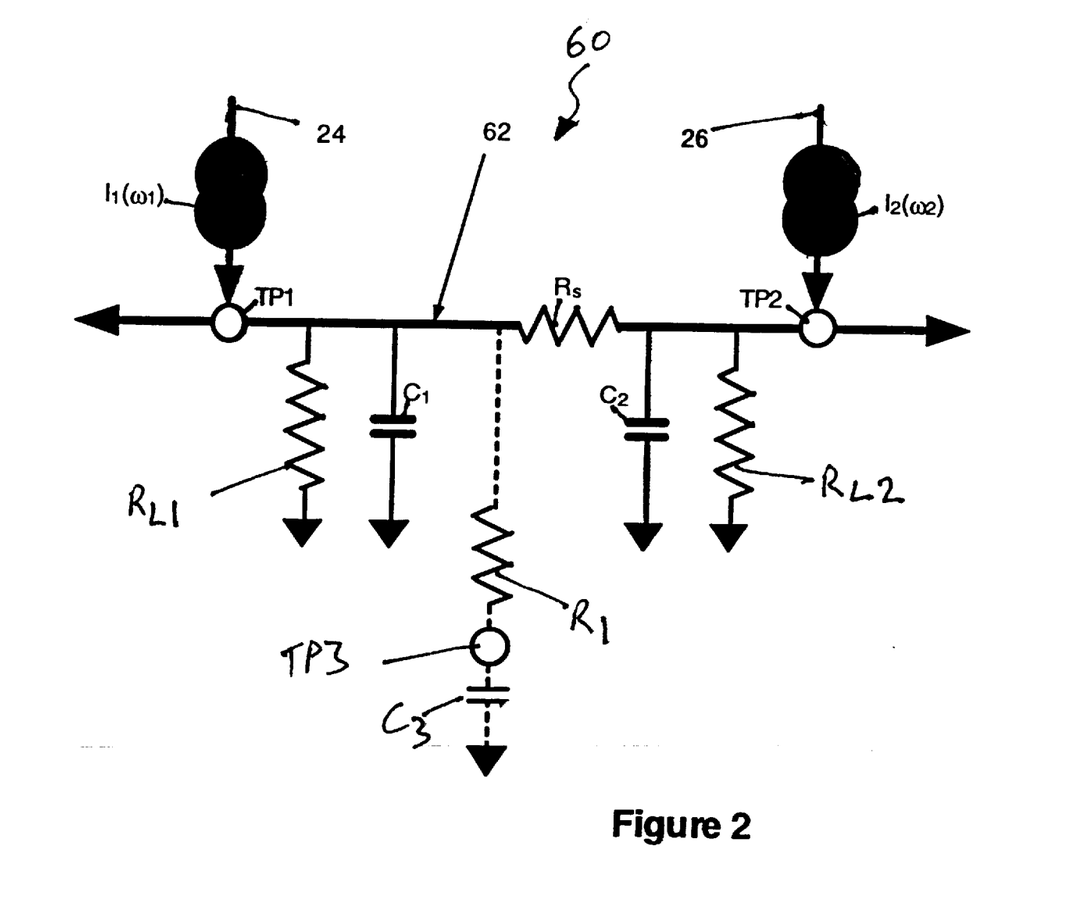
FIG. 2 illustrates an equivalent circuit of a trace in an interconnection network to be tested.

FIG. 2 illustrates schematically an equivalent circuit 60 model of a trace 62 in an interconnecting network on the DUT 34. Trace 62 connects two test points TP1 and TP2, in a network, and should be isolated from ground and other networks. Capacitances $C_1$ and $C_2$ represent the normal capacitance of the trace to ground planes. Resistances $R_{L1}$ and $R_{L2}$ represent unwanted leakage paths located on either side of an unwanted series resistance $R_S$. On an ideal trace 62, leakage resistances $R_{L1}$, and $R_{L2}$ should be very high, and series resistance Rs should be very low. FIG. 2 also shows a leakage resistance $R_1$ between trace 62 and an adjacent trace containing TP3. Ideally, leakage resistance $R_1$ should also be very high so that voltage on the first trace 62 does not induce voltage in its neighbors.

Detection of Voltage Contrast Signals

Appendix A discusses the mathematical description in detail. The following description reviews the important conclusions of this analysis.

When the test points TP1 and TP2 are illuminated by beams 24 and 26 respectively, a secondary electron current $\sigma I(\omega)$ is re-emitted from each test point, whose surface potential V varies with the beam current. The number of electrons reaching the detector depends upon where the test points are located. Collection efficiency may be pre-calibrated by using one beam to map the detector efficiency on a substrate with known test point locations.

For small voltage changes, the detected change in voltage contrast signal depends approximately upon $V/\Delta E$, where V is the surface potential of the test point and $\Delta E$ is the constant ($\approx 5$ eV) energy spread of secondary electron emission, and $\in$ is the collection efficiency from a test point. Thus the change in current that passes into the detector from each test point is:

$$I_d = \in \sigma I V / \Delta E$$

To account for varying collection efficiency, it is desirable to use a symmetric two step measuring cycle. The detector is first set up to observe TP1 and measure a total current $I_{t1}$. Then the detector is readjusted to observe TP2 and measure a total current $I_{t2}$. The beams are modulated at frequencies $\omega_1$ and $\omega_2$, so that the currents on the two test points, when the amplitude of the beam currents $I_1$ and $I_2$ is set equal to $I_0$, they are:

$$I_1 = I_0(1 + \sin \omega_1 t)$$

and $$I_2 = I_0(1 + \sin \omega_2 t).$$

As shown in Appendix A, Page A2, the detected signals are the sum of the signals $I_d$ from both test points, which depend upon the product of the current times the induced voltage. Since the induced voltages depend upon impedances, these signals are characteristic of the circuit under test.

Frequency Filtering to Isolate Impedance Data

Signals that depend only upon input, output or transimpedances may be extracted by frequency filtering the detected signal. As shown in Appendix A, Page A2, the detected signal contains components at frequencies of $2\omega_1$, $2\omega_2$ and $(\omega_1+\omega_2)$ as well as components at the base frequencies $\omega_1$ and $\omega_2$ and DC. The double frequency signal components that are used for testing interconnection networks are represented by the following:

a) Signal filtered at frequency $2\omega_1$ measured observing TP1 depends upon direct impedance $Z_{11}$ looking into TP1.

b) Signal filtered at frequency $2\omega_2$ measured observing TP2 depends upon direct impedance $Z_{22}$ looking into TP2.

c) Signal filtered at frequency $(\omega_1+\omega_2)$ measured looking at TP1 depends mostly upon the voltage induced at TP1 by the beam at TP2, which is measured by transimpedance $Z_{12}$.

d) Signal at frequency $(\omega_1+\omega_2)$ measured looking at TP2 depends mostly upon the voltage induced at TP2 by the beam at TP1, which is measured by transimpedance $Z_{21}$.

Note that all of these signals are simultaneously present at different frequencies in the detected signal, but may be separated by frequency filtering. Therein lies the main advantage of AC modulation.

Signal Processing

Figure 3:
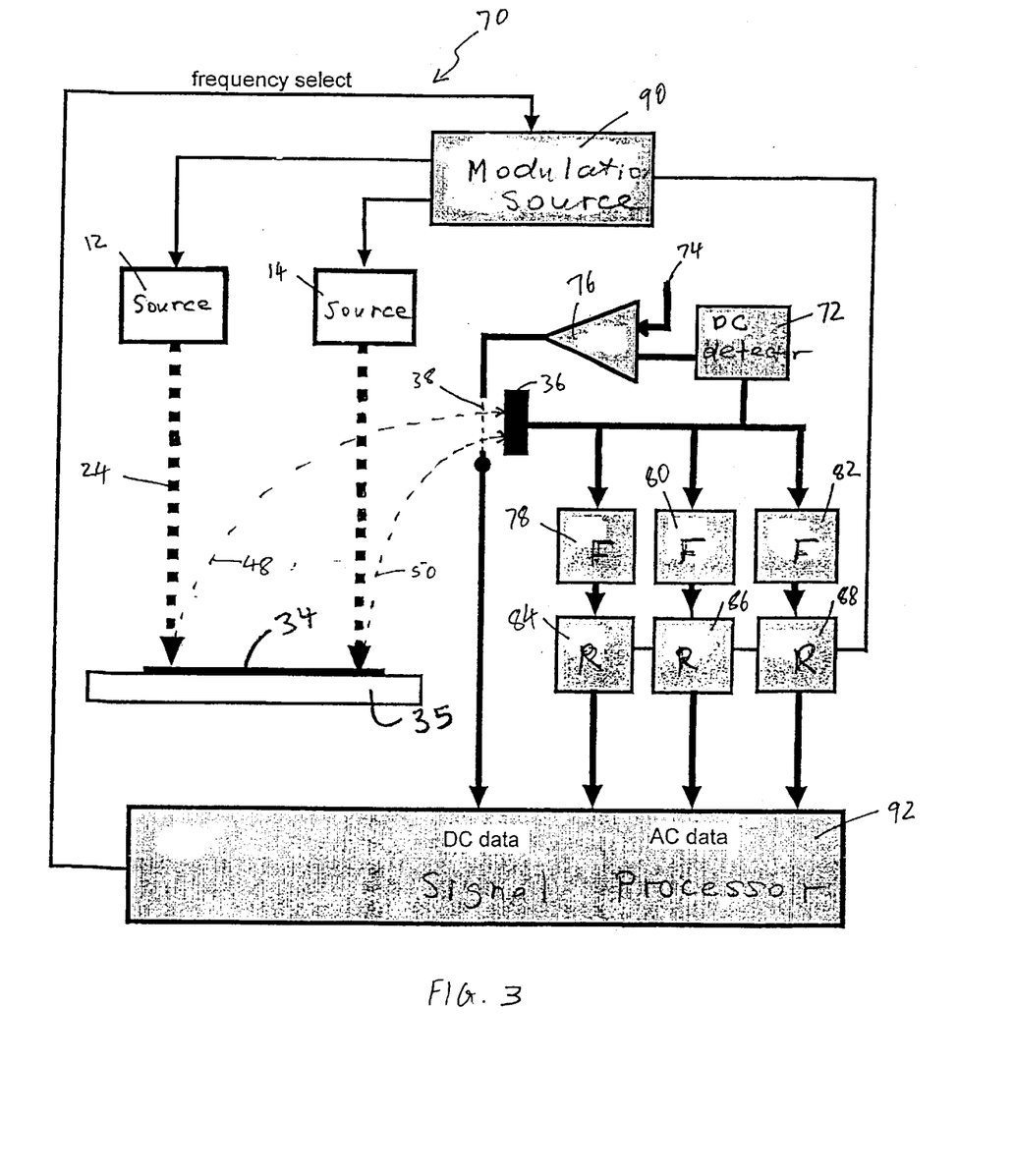
FIG. 3 illustrates in further detail the detector system of apparatus illustrated in FIG. 1.

FIG. 3 illustrates elements of signal processor 70, each block of which is conventional circuitry or software executing by a suitable processor, and FIG. 3 includes elements from FIG. 1. The detector 36 outputs the combined detected signal from TP1 and TP2. DC filter 72 extracts the total current, which is compared with a DC reference voltage applied on line 74 to operational amplifier 76 and used to drive a servo (not shown) to keep the detector grid 38 bias voltage at an optimum value to maximize the AC signals. Narrow band filters 78, 80, 82 tuned to beam modulation frequencies $2\omega_1$, $2\omega_2$ and $(\omega_1+\omega_2)$ extract suitable components of the signal, and pass these to rectifiers 84, 86, 88 that convert them to DC signals suitable for integration and sampling in the signal processor 92.

Alternatively, the filters 78, 80, 82 may be configured as synchronous detectors whose phase reference is derived from the same source 90 as the gun modulation signals. This method may be used to further reduce noise and increase selectivity.

An additional DC detector and comparator 72 for performing simultaneous DC measurements, and optionally for modulating the grid 38 voltage is also shown.

After passing through the filters, each of these detector signals is first rectified to measure its amplitude, and then sampled by an A/D (analog to digital) converter. The data may be averaged over the measurement cycle, and divided by the appropriate pre-calibrated collection efficiency $\in_{11}$ or $\in_{22}$ to obtain signals characteristic of impedances $Z_{11}$ and $Z_{22}$. Alternatively, the two direct impedance signals $I_{D1}$ and $I_{D2}$ are then squared and added together to create a characteristic input/output direct impedance value $S_D^2 = (I_{D1}/\in_{11})^2 + (I_{D2}/\in_{22})^2$. This technique tends to suppress the effects of variation in collection efficiency that depend upon the distance between test points.

The transimpedance signals from TP1 and TP2 may be added in the data processing to minimize the effect of distance between the two test points. Signals $I_{T1}$ and $I_{T2}$ are first added and then squared (reflecting the fact that the transimpedance signals, both at frequency $(\omega_1+\omega_2)$, are superimposed in the original signal), thus creating a characteristic transimpedance value $S_T^2 = [(I_{T1}/\in_{11}) + (I_{T2}/\in_{22})]^2$.

As shown in Appendix A, Page A3, this signal processing creates the following characteristic signals:

$$S_D^2 = (I_{D1}/\in_{11})^2 + (I_{D2}/\in_{22})^2 =$$

$$[\sigma(1-\sigma)I_0^2/2\Delta E]^2 [Z_{11}^2(\omega_1) + Z_{22}^2(\omega_2)]$$

$$S_T^2 = [(I_{T1}/\in_{11}) + (I_{T2}/\in_{22})]^2 =$$

$$[\sigma(1-\sigma)I_0^2/2\Delta E]^2 \{Z_{12}(\omega_2) +$$

$$(\in_{21}/\in_{22})Z_{12}(\omega_2) + Z_{21}(\omega_1) +$$

$$(\in_{12}/\in_{11})Z_{21}(\omega_1)\}^2 \approx$$

$$[\sigma(1-\sigma)(1+\in)I_0^2 2\Delta E]^2 \{Z_{12}(\omega_2) +$$

$$Z_{21}(\omega_1)\}^2$$

The following combined impedances are particularly useful for recognizing interconnect defects. They are given below in terms of measured signals $S_D$ and $S_T$ defined above and the average cross coupling factor ∈ of the signals from the test point are not being observed by the detector.

$$[Z_{11}^2(\omega_1)+Z_{22}^2(\omega_2)]^{1/2}=S_D(2\omega_1,2\omega_2)/[\sigma(1-\sigma)I_0^2/2\Delta E][Z_{12}(\omega_2)+Z_{21}(\omega_1)]\approx S_T(\omega_1+\omega_2)/[\sigma(1-\sigma)(1+\in)I_0^2/2\Delta E]$$

where ∈ is the collection efficiency.

These signals are unavoidably there simultaneously, but the detector can only be aimed at one site at a time. Thus, they are obtained by looking at TP1 and TP2 sequentially and adding the results in the signal processor.

Thus we can selectively measure impedances in two steps. First, by filtering the signal from a voltage contrast detector that simultaneously observes the effect at TP1 of illumination at TP1 and TP2 by two separate beams. Next, the effect at TP2 of illumination at TP1 and TP2 by two separate beams is observed and filtered. Selectivity may be extended using phase sensitive detection, whose output is maximized when the filter is tuned to the phase shift between the output and beam modulation, thus measuring the phase as well as amplitude of impedance. Phase sensitive detection reduces noise and makes it is possible to separate the two transimpedances. A tester designed only to recognize short circuits and leakage does not require this refinement.

Frequency Ratio Techniques

One signal processing method that is particularly effective for measuring leakage resistance $R_L$ uses the ratios of signals $S_D$ and $S_T$ taken at two different beam modulation frequencies. By changing modulation frequencies proportionally, for example changing $\omega_1$ to $n\omega_1$ and $\omega_2$ to $n\omega_2$, and $(\omega_1+\omega_2)$ to $n(\omega_1+\omega_2)$, and by also changing the detector filters proportionally, one may perform impedance measurements at two different frequencies. The direct impedance ratio [n $S_{Dn}/S_D]^2$ and transimpedance ratio[$nS_{Tn}/S_T$] may be calculated in the signal processor after the data is recorded. In these expressions, we simplify the expressions using $\omega_0=(\omega_1+\omega_2)/2$ which is valid where $\omega_1\approx\omega_2$, and $\omega_1+\omega_2\approx2\omega_0$.

Direct impedance ratio $\rho_{DD}^2=n^2S_{Dn}^2(n\omega_0/S_{D0}^2(\omega_0)]^2$ Transimpedance ratio $\rho_{TT}^2=n^2S_{Tn}^2(n\omega_0)/S_{T0}^2(\omega_0)$ As shown in Appendix A, Page A4, multiplying the signal ratio by a factor n assures that ratio for a defect free circuit will be one.

To obtain signals $S_D$ and $S_T$ derived from the ratio of two beam modulation frequencies, signals $S_D$ and $S_T$ are measured at average beam modulation frequencies $\omega_0$ during one cycle, and then measured signals at $n\omega_0$ during a second cycle. Beam modulations at $\omega_1$ and $n\omega_1$ could also be simultaneously superimposed upon beam illuminating TP1, and modulations at $\omega_2$ and $n\omega_2$ simultaneously superimposed upon beam illuminating TP2 using a modulation function $I=I_0[1+\sin \omega t/2+\sin n\omega t/2]$. In this case, filters at all the necessary frequencies could be used to separate signal components at the same time.

Transimpedance to Direct Impedance Ratio Techniques

Another signal processing method that is particularly effective for measuring series resistances $R_S$ uses the ratio of the transimpedance signal to twice the direct impedance signal measured at the same average beam modulation frequency. Either low average frequencies $\omega_0$ or higher frequency $n\omega_0$ may be selected to improve the sensitivity to parallel or series resistances respectively. The most useful trans/direct impedance ratios are:

Low frequency T/D ratio $\rho_{TD0}^2=S_{T0}^2(\omega_0)/2S_{D0}^2(\omega_0)$

High Frequency T/D ratio $\rho_{TDn}^2=S_{Tn}^2(n\omega_0)/2S_{Dn}^2(n\omega_0)$ Both these ratio methods have several advantages. The ratio of any two signal measurements cancels out the factor $[\sigma(1-\sigma)(1+\in)I_0^2/2\Delta E]$ in each signal. When data for ratios is taken simultaneously, the same beam current, collection efficiency and secondary emission coefficient values apply to both signals, and signal ratios becomes independent of variations these parameters. This is particularly important since both the energy and collection efficiency of secondary electrons are unpredictably influenced by DC charge buildup at or near the test points, which deflects secondary electrons on their way to the detector. Similarly, beam exposure can induce time varying changes in the secondary emission coefficient. Both ratio measurements are insensitive to these error sources.

The fact that capacitive impedance depends upon frequency may be exploited to find relatively small and large resistances upon traces with an unknown capacitance. The leakage resistance becomes more apparent at lower beam modulation frequencies, and series resistance becomes more apparent at high frequencies. Thus appropriate selection of beam modulation frequency can increase sensitivity to the most important kinds of circuit defects. The direct impedance number, transimpedance number, direct impedance ratio, transimpedance ratio, low frequency T/D ratio, high frequency T/D ratio, combined direct impedance and combined transimpedance are all used to detect interconnection defects as illustrated by following examples.

Figure 4A:
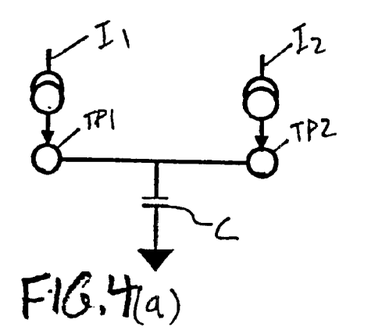
FIGS. 4a–4f illustrate equivalent circuits for interconnection network trace with different possible defect.

Illustrative Examples of Measurement of Series and Parallel Resistances in Networks Appendix A, Page A4–A7, give the following illustrative examples of measurement of series and parallel resistances in networks. The two above described modulated beam system with ratio data processing methods are used to identify defective networks and estimate unwanted parallel and series resistance. Criteria for identifying defective networks, and calculation of unwanted series and parallel resistances using the ratio data are illustrated. The equivalent circuit of an ideal trace on an interconnection network is shown in FIG. 4a. FIGS. 4b–4f illustrate equivalent circuits for an interconnection network trace with different possible defects. In FIGS. 4b–4f, C is the total capacitance between the trace and the network(network capacitance), $C_3$ is the capacitance between the trace and the adjacent trace, $R_S$ is the series resistance in the trace, $R_L$ is the leakage resistance between the trace and the ground and $R_1$ is the leakage resistance between the trace and the adjacent trace. Expected values of the ratios $\rho_{DD}^2=n^2S_{Dn}^2/S_{D0}^2$, $\rho_{TT}^2=n^2S_{Tn}^2/S_{T0}^2$, $\rho T_{TD0}^2=S_{T0}^2/2S_{D0}^2$, and $\rho_{TDn}^2=S_{Tn}^2/2S_{Dn}^2$ are calulated from the impedances and used as criteria to identify which kind of network defect is involved. The ratio that is most sensitive to the leakage or series resistance is then used to calculate the resistance.

Case a (Acceptable Trace)

A voltage contrast signal from the test points TP1 and TP2 is detected by detector 36 and processed by the signal processor 70. The signal processor 70 calculates the complex impedance of the trace, and based on the complex impedance further calculates the characteristics ratios.

When a signal processor, based on the value of complex impedance derived from the detected voltage contrast signal, calculates a value of one for all of the characteristic ratio parameters, an acceptable trace where the leakage resistance $R_L$ is infinite and series resistance $R_S$ is zero is identified. An equivalent circuit of an ideal trace is shown in FIG. 4a.

Case b (Trace with Excessive Leakage to Ground)

Figure 4B:
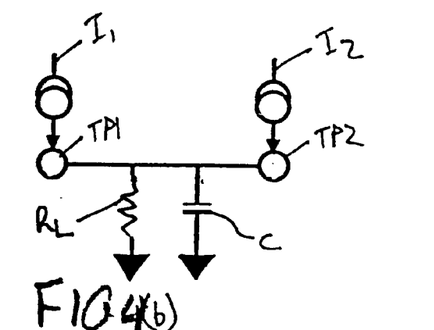

FIG. 4b shows an equivalent circuit for a trace with excessive leakage to ground. A voltage contrast signal from the test points TP1 and TP2 is detected by detector 36 and processed by the signal processor 70. The signal processor 70 calculates the complex impedance of the trace, and based on the complex impedance further calculates the characteristics ratios.

A trace with excessive leakage to the ground is identified by both the direct impedance ratio $\rho_{DD}{}^2$ and transimpedance ratio $\rho_{TT}{}^2$ being substantially greater than one. Ratios of signals measured at the same base frequency, ($\rho_{TD0}{}^2$ and $\rho_{TDn}{}^2$) are not useful for calculating leakage resistance because the direct and transimpedances are the same. It is necessary to use the ratios of two different frequencies ($\rho_{DD}{}^2$ or $\rho_{TT}{}^2$) to calculate leakage resistance. One may solve the equation for $\rho_{TD0}{}^2$ for $R_L$, finding the resistance as a function of the frequency and trace capacitance for this case. A low beam modulation frequency $\omega_0$ is desirable for measuring large leakage resistance because the factor $1/\omega_0 C$ is higher when $\omega_0$ is low.

Cases c and d (Trace with Excessive Series Resistance Near the Test Points)

Figure 4C:
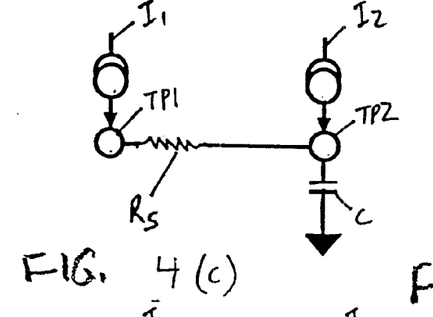
Figure 4D:
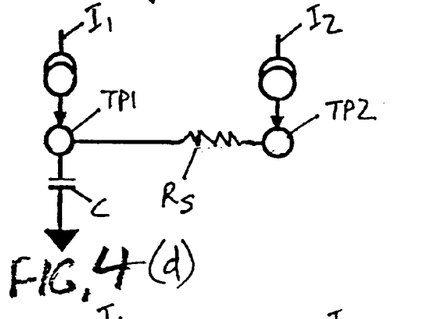

FIGS. 4c–4d show an equivalent circuit of a trace with excessive series resistance near the test point. A voltage contrast signal from the test points TP1 and TP2 is detected by detector 36 and processed by the signal processor 70. The signal processor 70 calculates the complex impedance of the trace, and based on the complex impedance further calculates the characteristics ratios.

A trace with excessive series resistance is identified by the transimpedance ratio $\rho_{TDn}{}^2$ being substantially less than 1. The break is near the end when $\rho_{DD}{}^2$ is substantially larger than one.

The high beam modulation frequency $n\omega_0$ measurement is desirable for measuring low series resistance because the factor $1/n\omega_0 C$ is lower when $n\omega_0$ is high.

Case e (Trace with Excessive Series Resistance Near the Middle of the Trace)

Figure 4E:
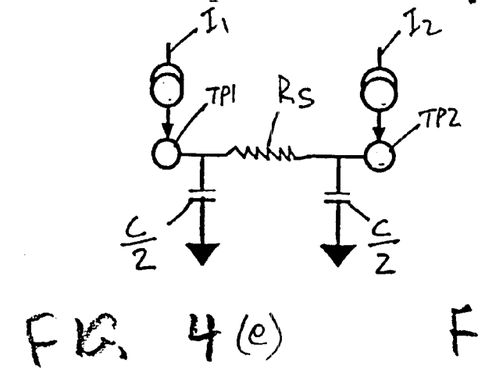

FIG. 4e shows an equivalent circuit of a trace with excessive series resistance near the middle of the trace. A voltage contrast signal from the test points TP1 and TP2 is detected by detector 36 and processed by the signal processor 70. The signal processor 70 calculates the complex impedance of the trace, and based on the complex impedance further calculates the characteristics ratios.

As in the previous example, a trace with excessive series resistance is identified by the transimpedance ratio $\rho_{TDn}{}^2$ being substantially less than 1. In general, deviations of $\rho_{TDn}{}^2$ from 1 indicate excessive series resistance.

Except for the factor 2 instead of $\sqrt{2}$, the measured resistance is the same as cases c and d where the break is near one end of the network. Thus, the ratio technique allows approximate determination of the series resistance without knowing exactly where the break is located. A high primary beam modulation frequency $n\omega_0$ makes the expression more sensitive to small series resistance because the factor $1/n\omega_0 C$ is low.

Case f (Leakage Resistance to an Adjacent Trace)

Figure 4F:
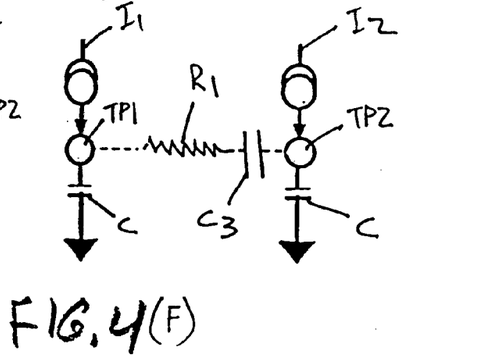

In this case, the measurement looks for high resistance between network traces, so only transimpedance measurements are useful. FIG. 4f shows two networks each represented by a capacitance C, and connected by a parasitic capacitance $C_3$ and a resistance $R_1$. A voltage contrast signal from the test points TP1 and TP2 is detected by detector 36 and processed by the signal processor 70. The signal processor 70 calculates the complex impedance between the two test points TP1 and TP2, and based on the complex impedance further calculates the characteristics ratios.

Unwanted connections between traces are recognized by high T/D ratios that indicate more than the normal capacitive coupling. Since in this case we are looking for high resistances, this must be measured by looking between test points 1 or 2 and the other trace. Thus one may best detect larger intertrace resistances using low base frequencies under conditions of low parasitic capacitance.

Simultaneous DC and AC Measurements

Although more sensitive than DC techniques for finding series resistance $R_s$, the AC methods described above are not particularly sensitive to leakage resistances $R_L$ and $R_1$. This is because the period of the beam modulation frequency must be considerably less than the measurement time. DC methods operate essentially at the extreme low frequency limit. Prior art DC analysis performed simultaneously with the AC tests can raise the detection threshold for leakage resistance, thus increasing the range of measurement sensitivity for the system.

Simultaneous AC and DC methods are possible because the beam current $I_0(1+\sin \omega t)$ has an average DC component $I_0$. The DC charging signal may be observed at the detector output through a low pass filter whose bandwidth is compatible with the measurement cycle $t \approx 100$ $\mu$sec. The AC measurement cycle described above takes a time 4t. During this period, an average charging current of $2I_0(1-\sigma)$ (from both beams) charges the network to a voltage $V(t)=2I_0(1-\sigma)R_L[1-e^{-t/R_L C}]$. Charging is linear when $R_L$ is large. Using standard conditions given in the section describing the AC measurement thresholds), the voltage after charging time 4t is approximately:

$$\Delta V_0 = V(4t) - V(0) = 2I_0(1-\sigma)R_L[1 - e^{-4t/R_L C}]$$

$$\approx [8I_0(1-\sigma)t/C] \approx 2.5 \text{ V}$$

If the charging beams are turned off at time 4t, the circuit discharges at a rate $dV(t)/dt = \Delta V_0(4t)e^{-t/R_L C}$. The leakage resistance $R_L$ may be measured by observing the voltage decay over an additional period t and using the relation expressed in the relationship expressed in the following equation.

$$\Delta V_L = V_0(5t) - V_0(4t) = 2I_0(1-\sigma)R_L[1 - e^{-4t/R_L C}][1 - e^{-t/R_L C}]$$

$$\approx 8I_0(1-\sigma)t^2/C^2 R_L$$

After the cycle of AC measurements are completed, and during the time spent waiting for the network to discharge, one may use both beams to alternately sample adjacent traces to see whether they have also charged up through inter-trace resistances $R_1$. Inter trace resistance $R_1$ may be measured by observing the charge buildup on these traces and using the relationship expressed in the following equation.

$$\Delta V_1 = V_1(4t) - V_1(0) = 2I_0(1-\sigma)R_L[1 - e^{-4t/R_L C}][1 - e^{-t/R_1 C}]$$

$$\approx 4I_0(1-\sigma)t^2/C^2 R_1$$

From the above, the detector current signals associated with these voltage rises are $\Delta S = I_d/\in \approx \sigma I_0 \Delta V/\Delta E$ (Amps). To minimize errors, one may divide the signals measured after the beam is turned off by signal measured before the beam is turned off, obtaining the first ratio $[\Delta S_L/\Delta S_0]=[\Delta V_L/\Delta V_0]=$ $t/CR_L$ and the second ratio $[\Delta S_1/\Delta S_0]=[\Delta V_1/\Delta V_0]=t/CR_1$. The leakage resistances determined from these ratios are:

$$R_L \approx t/C[\Delta S_L/\Delta S_0]$$

$$R_1 \approx t/C[\Delta S_1/\Delta S_0]$$

The DC measurements used in conjunction with AC measurements can enhance the usefulness of the technique.

Estimates show that the detection threshold for DC measurements is substantially higher than the threshold predicted using the AC method, illustrating the advantage of combining AC and DC methods. Noise estimates suggest that the total detection range of the system illustrated here ranges from 720 Ohm minimum series resistance to 40 MOhm maximum parallel resistance, which is far superior to conventional systems using one beam with no modulation in measuring the series resistance at the same time being adequate for measuring leakage resistance.

This disclosure is illustrating, but not limiting; further modifications will be apparent to one skilled in the art in light of this disclosure and are intended to fall within the scope of the appended claims.

APPARATUS AND METHOD FOR TESTING OF INTERCONNECTION CIRCUITRY USING SEVERAL MODULATED BEAMS

MATHEMATICAL APPENDIX A

A. Response of Interconnected Test Points to Modulated Beams.

The circuit in FIG. 2 has a characteristic input impedance $Z_{11}=V_1/I_1$ between test point 1 (TP1) and ground, describing the voltage response $V_1$ to current $I_1$ injected at TP1. It also has output impedance $Z_{22}$ between test point 2 (TP2) and ground, describing the response $V_2$ to current $I_2$ injected at TP2. Since the points are interconnected, a complete specification of the network also requires a transimpedance $Z_{21}$ describing the response $V_2$ at test point TP2 to current $I_1$ injected at TP1, and transempedance $Z_{12}$ describing the response $V_1$ at TP1 to current $I_2$ injected at TP2. Impedance is frequency dependent, and may be described by complex (real plus imaginary) numbers $Z_0 e^{i\phi}$, with amplitude $Z_0$ and a phase $\phi$. $Z_0$ is the amplitude of the complex impedance, found by evaluating the square root of the complex impedance times its conjugate. Impedance is calculated from the elements within the circuit, which have a resistive component R, a capacitive component $I/i\omega C$ and an inductive component $i\omega L$ (Ohms).

A key novel feature of this system is its use of AC modulated beams. The beam aimed at test point 1 is modulated $I_1(\omega_1)=I_{10}(I+\sin \omega_1 t)$ and the beam aimed at test point 2 is modulated $I_2(\omega_1)=I_{20}(1+\sin \omega_2 t)$ where $\omega_1$ is approximately but not exactly equal to $\omega_2$. Note that the current still has a DC component because electron flux cannot be negative.

If $\sigma$ is the secondary emission coefficient, each beam injects a current $(1-\sigma)I(\omega t)$ into its test point. The voltage response of the circuit at the two test points each depends upon the current injected into both test points in the following way:

Voltage at TP1 $(1-\sigma) \{Z_{11}(\omega_1)I_1[1+\sin(\omega_1 t+\phi_{11})]+Z_{12}(\omega_2)I_2[1+\sin(\omega_2 t+\phi_{12})]\}$ Voltage at TP2 $(1-\sigma) \{Z_{21}(\omega_1)I_1[1+\sin(\omega_1 t>>\phi_{21})]+Z_{22}(\omega_2)I_2[1+\sin(\omega_2 t>>\phi_{22})]\}$ B. Detection of Voltage Contrast Signals.

A secondary electron current $\sigma I(\omega)$ is re-emitted from each test point, whose surface potential is V. The number of electrons reaching the detector depends upon where the test points are located. Collection efficiency $\epsilon_{11}$ is the fraction of secondary electrons that reach the detector from test point 1 when the detector is adjusted to maximize the signal from TP1. Collection efficiency $\epsilon_{22}$ is the fraction of secondary electrons that reach the detector from test point 2 when the detector is adjusted to maximize the signal from TP2. $\epsilon_{11}$ and $\epsilon_{22}$ may be pre-calibrated by using one beam to map the detector efficiency on a substrate with known test point locations.

Collection efficiency $\epsilon_{12}$ is the fraction of secondary electrons that reach the detector from test point 2 when the detector is adjusted to maximize the signal from TP1, and collection efficiency $\epsilon_{21}$ is the fraction of secondary electrons that reach the detector from test point 1 when the detector is adjusted to maximize the signal from TP2. If the test points are close together, signals from both test points are detected simultaneously and $\epsilon_{12}=\epsilon_{11}$ and $\epsilon_{21}=\epsilon_{22}$. When the test points are far apart, and the detector is tuned to observe one of the two test points, and electrons from the other test point are lost, so $\epsilon_{21}=\epsilon_{12}=0$. Although these sensitivities could be mapped out for each possible combination of test point locations, it is more desirable to design signal processing algorithms that minimize the effects of varying detection efficiency.

For small voltage changes, the detected change in voltage contrast signal depends approximately upon $V/\Delta E$, where V is the surface potential and $\Delta E$ is the (constant) energy spread of secondary electron emission. Thus the change in current that passes into the detector from each test point is $$I_d = \epsilon \sigma I \, V/\Delta E.$$

Generally, the amplitude of the beam currents $I_1$ and $I_2$ are both set equal to $I_0$, so that $I_1=I_0(1+\sin \omega_1 t)$ and $I_2=I_0(1+\sin \omega_2 t)$. To account for varying collection efficiency, it is desirable to use a symmetric two step measuring cycle. The detector is first set up to look at TP1 and measure a total current $I_{t1}$. Then the detector is readjusted to look at TP2 and measure a total current $I_{t2}$. The total detected currents in the first and second cycle are given by the following equations:

Signal with detector looking at TP1:

$$I_{t1} = [\sigma(1-\sigma)I_0^2/\Delta E]\{\varepsilon_{11}Z_{11}(1+\sin\omega_1 t)[(1+\sin(\omega_1 t+\phi_{11})]+$$
$$\varepsilon_{11}Z_{12}(\omega_2)(1+\sin\omega_1 t)[(1+\sin(\omega_2 t+\phi_{12})]+$$
$$\varepsilon_{12}Z_{21}(\omega_1)(1+\sin\omega_2 t)[(1+\sin(\omega_1 t+\phi_{21})]+$$
$$\varepsilon_{12}Z_{22}(1+\sin\omega_2 t)[(1+\sin(\omega_2 t+\phi_{22})]\}$$

Signal with detector looking at TP2:

$$I_{t2} = [\sigma(1-\sigma)I_0^2/\Delta E]\{\varepsilon_{21}Z_{11}(1+\sin\omega_1 t)[(1+\sin(\omega_1 t+\phi_{11})]+$$
$$\varepsilon_{21}Z_{12}(\omega_2)(1+\sin\omega_1 t)[(1+\sin(\omega_2 t+\phi_{12})]+$$
$$\varepsilon_{22}Z_{21}(\omega_1)(1+\sin\omega_2 t)[(1+\sin(\omega_1 t+\phi_{21})]+$$
$$\varepsilon_{22}Z_{22}(1+\sin\omega_2 t)[(1+\sin(\omega_2 t+\phi_{22})]\}$$

C. Frequency Filtering to Isolate Different Impedances.

Signals that depend only upon input, output or transimpedences may be extracted by frequency filtering the detected signal. The following trigonometric relations are useful to simplify the expression for the signal.

$$\sin x \sin(y+\phi) = \tfrac{1}{2}[\cos(x-y-\phi)-\cos(x+Y+\phi)],$$

and $$\sin x \sin(x+\phi) = \tfrac{1}{2}[\cos(\phi)-\cos(2x+\phi)]$$

Substituting these relationships, we find that the detected signal contains components at frequencies of $2\omega_1$, $2\omega_2$ and $(\omega_1+\omega_2)$ as well as components at the base frequencies $\omega_1$ and $\omega_2$ and DC. The double frequency signal components that are particularly suitable for testing are:

Signal filtered at frequency $2\omega_1$ measured looking at TP1
$$I_{D1}(2\omega_1) = [\sigma(1-\sigma)I_0^2/2\Delta E]\,\varepsilon_{11}Z_{11}(\omega_1)\cos(2\omega_1 t + \phi_{11})$$

Signal filtered at frequency $2\omega_2$ measured looking at TP2
$$I_{D2}(2\omega_2) = [\sigma(1-\sigma)I_0^2/2\Delta E]\,\varepsilon_{22}Z_{22}(\omega_2)\cos(2\omega_2 t + \phi_{22})$$

Signal filtered at frequency $(\omega_1 + \omega_2)$ measured looking at TP1
$$I_{T1}(\omega_1+\omega_2) = [\sigma(1-\sigma)I_0^2/2\Delta E]\,[\varepsilon_{11}Z_{12}(\omega_2)\cos(\omega_1+\omega_2 \approx \phi_{12}) + \varepsilon_{12}Z_{21}(\omega_1)\cos(\omega_1+\omega_2 \approx \phi_{21})]$$

Signal at frequency $(\omega_1+\omega_2)$ measured looking at TP2
$$I_{T2}(\omega_1+\omega_2) = [\sigma(1-\sigma)I_0^2/2\Delta E]\,[\varepsilon_{22}Z_{21}(\omega_1)\cos(\omega_1+\omega_2 \approx \phi_{21}) + \varepsilon_{21}Z_{12}(\omega_2)\cos(\omega_1+\omega_2 \approx \phi_{12})]$$

After passing through the filters, each of these detector current is first rectified to measure its amplitude, and then sampled by an A/D converter. The data is then averaged over the measurement cycle, and divided by the appropriate pre-calibrated collection efficiency $\varepsilon_{11}$ or $\varepsilon_{22}$. The two direct impedance signals $I_{D1}$ and $I_{D2}$ are then squared and added together to create a characteristic input/output impedance number $S_D^2 = (I_{D1}/\varepsilon_{11})^2 + (I_{D2}/\varepsilon_{22})^2$.

The transimpedance signals are also added in the data processing to minimize the effect of distance between the two test points. Signals $I_{T1}$ and $I_{T2}$ are first added and then squared (reflecting the fact that the transimpedance signals, both at frequency $(\omega_1+\omega_2)$, are superimposed in the original signal), thus creating a characteristic transimpedance number $S_T^2 = [(I_{T1}/\varepsilon_{11})+(I_{T2}/\varepsilon_{22})]^2$. From the symmetry, efficiencies $\varepsilon_{12}$ and $\varepsilon_{21}$ will be approximately equal, so that $(\varepsilon_{12}/\varepsilon_{11}) \approx (\varepsilon_{21}/\varepsilon_{22}) = \varepsilon$. This signal processing creates the following data:

$$S_D^2 = (I_{D1}/\varepsilon_{11})^2 + (I_{D2}/\varepsilon_{22})^2$$
$$= [\sigma(1-\sigma)I_0^2/2\Delta E]^2\,[Z_{11}^2(\omega_1) + Z_{22}^2(\omega_2)]$$

$$S_T^2 = [(I_{T1}/\varepsilon_{11}) + (I_{T2}/\varepsilon_{22})]^2$$
$$= [\sigma(1-\sigma)I_0^2/2\Delta E]^2\,\{Z_{12}(\omega_2) + (\varepsilon_{21}/\varepsilon_{22})Z_{12}(\omega_2) + Z_{21}(\omega_1) + (\varepsilon_{12}/\varepsilon_{11})Z_{21}(\omega_1)\}^2$$
$$\approx [\sigma(1-\sigma)(1+\varepsilon)I_0^2/2\Delta E]^2\,\{Z_{12}(\omega_2) + Z_{21}(\omega_1)\}^2$$

Since beams induce signal components at $(\omega_1+\omega_2)$, one may only measure the sum $\{Z_{12}(\omega_2)+Z_{21}(\omega_1)\}$ of the transimpedances.

The following combined impedances are particularly useful for recognizing interconnect defects. They are given below in terms of measured signals S defined above.

$$[Z_{11}^2(\omega_1)+Z_{22}^2(\omega_2)]^{1/2} = S_D(2\omega_1, 2\omega_2)/[\sigma(1-\sigma)I_0^2/2\Delta E]$$

$$[Z_{12}(\omega_2)+Z_{21}(\omega_1)] \approx S_T(\omega_1+\omega_2)/[\sigma(1-\sigma)(1+\varepsilon)I_0^2/2\Delta E]$$

Thus we may selectively measure direct and transimpedances by filtering the signal from a voltage contrast detector that observes both test points simultaneously.

D. Ratios of Similar Impedances at Two Different Frequencies.

The fact that capacitive impedance depends upon frequency may be exploited to find relatively small and large resistances upon traces with an unknown capacitance. As will be shown in the example, leakage resistance becomes more apparent at lower beam modulation frequencies, and series resistance becomes more apparent at high frequencies. Appropriate selection of beam modulation frequency can increase sensitivity to the most important kinds of circuit defects.

The ratio of any two measurements S cancels out the term $[\sigma(1-\sigma)I_0^2/2\Delta E]$ in the individual signals, removing error sources that depend upon secondary emission coefficient, collection efficiency and beam current. This is particularly important since both the energy and collection efficiency of secondary electrons are unpredictably influenced by DC charge buildup at or near the test points, which deflects secondary electrons on their way to the detector. Similarly, beam exposure can induce time varying changes in the secondary emission coefficient. Ratio measurements are insensitive to many of these important error sources.

The frequency ratio method uses signals $S_D$ or $S_T$ taken at two different beam modulation frequencies. By changing modulation frequencies proportionally, for example changing $\omega_1$ to $n\omega_1$ and $\omega_2$ to $n\omega_2$, and $(\omega_1+\omega_2)$ to $n(\omega_1+\omega_2)$, and by also changing the detector filters proportionally, one may perform impedance measurements at two different frequencies. The ratios $[n\,S_{Dn}/S_{D0}]^2$ and $[n\,S_{Tn}/S_{T0}]$ may be calculated in the signal processor after the data is recorded as follows:

Direct impedance ratio
$$\rho_{DD}^2 = n^2 S_{Dn}^2(n\omega_0)/S_{D0}^2(\omega_0)]^2$$
$$= n^2[Z_{11}^2(n\omega_1)+Z_{22}^2(n\omega_2)]/[Z_{11}^2(\omega_1)+Z_{22}^2(\omega_2)]$$

Transimpedance ratio
$$\rho_{TT}^2 = n^2 S_{Tn}^2(n\omega_0)/S_{T0}^2(\omega_0)$$
$$= n^2[Z_{12}(n\omega_2)+Z_{21}(n\omega_1)]^2 / [Z_{12}(\omega_2)+Z_{21}(\omega_1)]^2$$

When $\omega_1 \approx \omega_2$, we may define $\omega_0 = (\omega_1 + \omega_2)/2$ as the average beam modulation frequency. Network impedances always contain a factor $1/\omega_0 C$ where C is the total capacitance of the networks. Higher frequency measurement at $n\omega$ always yields a smaller signal than the lower frequency measurement, so multiplying the signal ratio by a factor n assures that ratio for a defect free circuit will be one.

E. Transimpedance to Direct Impedance Ratio Techniques.

The ratio of the transimpedance signal to twice the direct impedance signal, measured at the same average beam modulation frequency, also provides useful information. Either low average frequencies $\omega_0$ or higher frequency $n\omega_0$ may be selected to improve the sensitivity to parallel or series resistances. The most useful trans/direct impedance ratios are:

$$\text{Low frequency T/D ratio} \quad \rho_{TD0}^2 = S_{T0}^2(\omega_0)/2S_{D0}^2(\omega_0)$$
$$= [Z_{12}(\omega_2) + Z_{21}(\omega_1)]^2 / 2[Z_{11}^2(\omega_1) + Z_{22}^2(\omega_2)]$$

$$\text{High frequency T/D ratio} \quad \rho_{TDn}^2 = S_{Tn}^2(n\omega_0)/2S_{Dn}^2(n\omega_0)$$
$$= [Z_{12}(n\omega_2) + Z_{21}(n\omega_1)]^2 / 2[Z_{11}^2(n\omega_1) + Z_{22}^2(n\omega_2)]$$

F. Illustrative Examples of the Measurement of Series and Parallel Resistances in Networks.

In this example, the novel two modulated beam ratio data processing methods are used to identify defective networks and estimate unwanted parallel and series resistance. Criteria for identifying defective networks, and calculation of unwanted series and parallel resistances using the ratio data are illustrated. The equivalent circuit of an ideal network is shown in FIG. 4a. Possible defective circuits are shown in FIG. 4b–f. Expected values of the ratios $\rho_{DD}^2 = n^2 S_{Dn}^2/S_{D0}^2$, $\rho_{TT}^2 = n^2 S_{Tn}^2/S_{T0}^2$, $\rho_{TD0}^2 = S_{T0}^2/2S_{D0}^2$, and $\rho_{TDn}^2 = S_{Tn}^2/2S_{Dn}^2$ are calculated from the impedances and used as criteria to identify which kind of network defect is involved. The ratio that is most sensitive to the leakage or series resistance is then used to calculate the resistance.

Case a (acceptable trace)

Complex impedances $Z_{11} = Z_{22} = Z_{11} = Z_{22} = [1/i\omega_0 C]$
Direct impedance signals $S_{D0}^2 = 2/(\omega_0 C)^2$ at $\omega_0$ $S_{Dn}^2 = 2/(n\omega_0 C)^2$ at $n\omega_0$
Transimpedance signals $S_{T0}^2 = 4/(\omega_0 C)^2$ at $n\omega_0$ $S_{Tn}^2 = 4/(n\omega_0 C)^2$ at $n\omega_0$
Direct impedance ratio at two frequencies $\rho_{DD}^2 = n^2 S_{Dn}^2/S_{D0}^2 = 1$
Transimpedance ratio at two frequencies $\rho_{TT}^2 = n^2 S_{Tn}^2/S_{T0}^2 = 1$
Transimpedance to direct impedance ratio at low frequency $\rho_{TD0}^2 = S_{T0}^2/2S_{D0}^2 = 1$
Transimpedance to direct impedance ratio at high frequency $\rho_{TDn}^2 = S_{T0}^2/2S_{D0}^2 = 1$ In this case, all of the characteristic ratio parameters are equal to one, indicating acceptable traces with infinite leakage resistance and zero series resistance.

Case b (excessive leakage to ground)

Complex impedances $Z_{11} = Z_{22} = Z_{11} = Z_{22} = R_L/(1 + i\omega_0 C R_L)$
Direct impedance signals $S_{D0}^2 = 2 R_L^2/[1 + (\omega_0 C R_L)^2]$
$S_{Dn}^2 = 2 R_L^2/[1 + (n\omega_0 C R_L)]$
Transimpedance signals $S_{T0}^2 = 4 R_L^2/[1 + (\omega_0 C R_L)^2]$
$S_{Tn}^2 = 4 R_L^2/[1 + (n\omega_0 C R_L)^2]$ Ratio signals:
$\rho_{DD}^2 = n^2[1 + (\omega_0 C R_L)^2]/[1 + (n\omega_0 C R_L)^2] \to 1$ if $R_L = \infty$ and $\to n^2$ if $R_L = 0$
$\rho_{TT}^2 = n^2[1 + (\omega_0 C R_L)^2]/[1 + (n\omega_0 C R_L)^2] \to 1$ if $R_L = \infty$ and $\to n^2$ if $R_L = 0$
$\rho_{TD0}^2 = [1 + (\omega_0 C R_L)^2]/[1 + (\omega_0 C R_L)^2] \to 1$ if $R_L = \infty$ and $\to 1$ if $R_L = 0$
$\rho_{TDn}^2 = [1 + (n\omega_0 C R_L)^2]/[1 + (n\omega_0 C R_L)^2] \to 1$ if $R_L = \infty$ and $\to 1$ if $R_L = 0$ We identify a trace with excessive leakage when both the direct impedance ratio $\rho_{DD}^2$ and transimpedance ratio $\rho_{TT}^2$ are substantially greater than one. Ratios of signals measured at the same base frequency, ($\rho_{TD0}^2$ and $\rho_{TDn}^2$) are not useful for calculating leakage resistance because the direct and transimpedances are the same. It is necessary to use two the ratios of two different frequencies ($\rho_{DD}^2$ or $\rho_{TT}^2$) to calculate leakage resistance. One may solve the equation for $\rho_{TD0}^2$ for $R_L$, finding the resistance as a function of the frequency and trace capacitance for this case:

$$R_L^2 = (1/\omega_0 C)^2 [(n^2 - \rho_{DD}^2)/n^2(\rho_{DD}^2 - 1)]$$
$$\Rightarrow (1/\omega_0 C)^2 [1/(\rho_{DD}^2 - 1)] \text{ as } R_L \Rightarrow \infty \text{ and } n \gg 1$$

Note that a low beam modulation frequency $\omega_0$ is desirable for measuring large leakage resistance because the factor $1/\omega_0 C$ is higher when $\omega_0$ is low.

Case c and d (trace with excessive series resistance near the test points)

Complex impedances $Z_{11} = Z_{12} = Z_{21} 1/i\omega_0 C$ and $Z_{22} = [1 + i\omega_0 C R_S]/i\omega_0 C$ or, $Z_{22} = Z_{12} = Z_{21} = 1/i\omega_0 C$ and $Z_{11} = [1 + i\omega_0 C R_S]/i\omega_0 C$
Direct impedance signals $S_{D0}^2 = [2 + (\omega_0 C R_S)^2]/(\omega_0 C)^2$
$S_{Dn}^2 = [2 + (n\omega_0 C R_S)^2]/(n \omega_0 C)^2$
Transimpedance signals $S_{T0}^2 = 4/(\omega_0 C)^2$ $S_{Tn}^2 = 4/(n \omega_0 C)^2$
Ratio Signals:
$\rho_{DD}^2 = n^2[2 + (\omega_0 C R_S)^2]/[2 + (n\omega_0 C R_S)^2] \to 1$ if $R_S = \infty$ and $\to n^2$ if $R_S = 0$
$\rho_{TT}^2 = 1 \to 1$ if $R_S = \infty$ and $\to 1$ if $R_S = 0$
$\rho_{TD0}^2 = 2/[2 + (\omega_0 C R_S)^2] \to 0$ if $R_S = \infty$ and $\to 1$ if $R_S = 0$
$\rho_{TDn}^2 = 2/[2 + (n\omega_0 C R_S)^2] \to 0$ if $R_S = \infty$ and $\to 1$ if $R_S = 0$ We identify networks with excessive series resistance when the transimpedence ratio $\rho_{TDn}^2$ is substantially less than 1. The break is near the end when $\rho_{DD}^2$ is substantially larger than one. The resistance as a function of the frequency and trace capacitance is calculated from the ratio $\rho_{TDn}^2$:

$$R_S^2 = (1/\omega_0 C)^2 [2(1 - \rho_{TDn}^2)/n^2 \rho_{TDn}^2]$$
$$\approx (\sqrt{2}/n\omega_0 C)^2 [1 - \rho_{TDn}^2] \text{ as } R_s \Rightarrow 0$$

Note that the high beam modulation frequency $n\omega_0$ measurement is desirable for measuring low series resistance because the factor $1/n\omega_0 C$ is lower when $n\omega_0$ is high.

Case e (excessive series resistance near the middle of the trace)

Complex impedances $Z_{11} = Z_{22} = (2/i\omega_0 C)[2 + i\omega_0 CR_s]/[4 + i\omega_0 CR_s]$ $Z_{12} = Z_{21} = (2/i\omega_0 C)/[4 + i\omega_0 CR_s]$ Direct impedance signals $S_{D0}^2 = [8/(\omega_0 C)^2][4 + (\omega_0 CR_s)^2]/[16 + (\omega_0 CR_s)^2]$ at $\omega_0$ $S_{Dn}^2 = [8/(n\omega_0 C)^2][4 + (n\omega_0 CR_s)^2]/[16 + (n\omega_0 CR_s)^2]$ at $n\omega_0$ Transimpedance parameter $S_{T0}^2 = [64/(\omega_0 C)^2]/[16 + (\omega_0 CR_s)^2]$ at $\omega_0$ $S_{T2}^2 = [64/(n\omega_0 C)^2]/[16 + (n\omega_0 CR_s)^2]$ at $n\omega_0$ Ratio signals:

$\rho_{DD}^2 = [4 + (n\omega_0 CR_s)^2][16 + (\omega_0 CR_s)^2]/[4 + (\omega_0 CR_s)^2][16 + (n\omega_0 CR_s)^2]$ if $R_s = \infty \Rightarrow 1$ if $R_s = 0$ $\rho_{TT}^2 = [16 + (\omega_0 CR_s)^2]/[16 + (n\omega_0 CR_s)^2] \Rightarrow 1/n^2$ if $R_s = \infty$ and $\Rightarrow 1$ if $R_s = 0$ $\rho_{TD0}^2 = 4/[4 + (\omega_0 CR_s)^2] \Rightarrow 0$ if $R_s = \infty$ and $\Rightarrow 1$ if $R_s = 0$ $\rho_{TDn}^2 = 4/[4 + (n\omega_0 CR_s)^2] \Rightarrow 0$ if $R_s = \infty$ and $\Rightarrow 1$ if $R_s = 0$ As in the previous example, we identify networks with excessive series resistance when the transimpedence ratio $\rho_{TDn}^2$ is substantially less than 1. In general, deviations of $\rho_{TDn}^2$ from 1 indicate excessive series resistance. The resistance as a function of the frequency and trace capacitance for this case is best calculated from the found from the ratio $\rho_{TDn}^2$:

$R_s^2 = (1/\omega_0 C)^2[4(1 - \rho_{TDn}^2)/n^2 \rho_{TDn}^2]$ $\approx (2/n\omega_0 C)^2(1 - \rho_{TDn}^2)$ as $R_s \Rightarrow 0$ Except for the factor 2 instead of √2, this expression is the same as cases c and d where the break is near one end of the network. Thus the ratio technique allows approximate determination of the series resistance without knowing exactly where the break is located. As in all series resistance measurements, a high primary beam modulation frequency $n\omega_0$ makes the expression more sensitive to small series resistance because the factor $1/n\omega_0 C$ is low.

Case f (leakage resistance to an adjacent trace)

In this case, the measurement looks for high resistance between networks, so only transimpedance measurements are useful. FIG. 4f shows two networks each represented by a capacitance C, and connected by a parasitic capacitance $C_3$ and a resistance $R_1$.

Complex impedances $Z_{11} = Z_{22} = (1/i\omega_0 C)[1 + i\omega_0(C + C_3)R_1]/[2 + i\omega_0(C + 2C_3)R_1]$ $Z_{12} = Z_{21} = (1/i\omega_0 C)[1 + i\omega_0 C_3 R_1]/[2 + i\omega_0(C + 2C_3)R_1]$ Direct impedance parameter $S_{D0}^2 = [2/(\omega_0 C)^2]\{1 + [\omega_0(C + C_3)R_1]^2\}/\{4 + [\omega_0(C + 2C_3)R_1]^2\}$ $S_{Dn}^2 = [2/(n\omega_0 C)^2]\{1 + [n\omega_0(C + C_3)R_1]^2\}/\{4 + [n\omega_0(C + 2C_3)R_1]^2\}$ Transimpedance parameter $S_{T0}^2 = [4/(\omega_0 C)^2][1 + (\omega_0 C_3 R_1)^2]/\{4 + [\omega_0(C + 2C_3)R_1]^2\}$ $S_{Tn}^2 = [4/(n\omega_0 C)^2][1 + (n\omega_0 C_3 R_1)^2]/\{4 + [n\omega_0(C + 2C_3)R_1]^2\}$ Ratio signals $\rho_{DD}^2 = \{1 + [n\omega_0(C + C_3)R_1]^2\}\{4 + [\omega_0(C + 2C_3)R_1]^2\}/\{1 + [\omega_0(C + C_3)R_1]^2\}\{4 + [n\omega_0(C + 2C_3)R_1]^2\} \Rightarrow$ 1 if $R_1 = \infty$ and $\Rightarrow 1$ if $R_1 = 0$ $\rho_{TT}^2 = \{1 + (n\omega_0 C_3 R_1)^2\}\{4 + [\omega_0(C + 2C_3)R_1]^2\}/\{1 + (\omega_0 C_3 R_1)^2\}\{4 + [n\omega_0(C + 2C_3)R_1]^2\} \Rightarrow$ 1 if $R_1 = \infty$ and $\Rightarrow 1$ if $R_1 = 0$ -continued $$\rho_{TD0}^2 = \{1 + (\omega_0 C_3 R_1)^2\} / \{1 + [\omega_0(C + C_3)R_1]^2\} \Rightarrow C_3^2/(C + C_3)^2 \text{ if } R_1 = \infty \text{ and } \Rightarrow 1 \text{ if } R_1 = 0$$
$$\Rightarrow 0 \text{ if } R_1 = \infty \text{ and } C_3 \ll C$$
$$\rho_{TDn}^2 = \{1 + (n\omega_0 C_3 R_1)^2\} / \{1 + [n\omega_0(C + C_3)R_1]^2\} \Rightarrow C_3^2/(C + C_3)^2 \text{ if } R_1 = \infty \text{ and } \Rightarrow 1 \text{ if } R_1 = 0$$
$$\Rightarrow 0 \text{ if } R_1 = \infty \text{ and } C_3 \ll C$$

Properly isolated traces are recognized by low transimpedance/direct impedance ratios $\rho_{TD0}^2$ that depend upon $C_3$. Unwanted leakage between traces is recognized by higher ratios approaching one that indicate more than the normal capacitive coupling. Since this case looks for high resistances, the ratio $\rho_{TD0}^2$ is appropriate for calculating the intertrace leakage resistance:

$$R_1 = (1 - \rho_{TD0}^2) / \{\rho_{TD0}^2[\omega_0(C + C_3)]^2 - (\omega_0 C_3)^2\}$$

When parasitic capacitance $C_3$ is much less than either network capacitance C, and when $R_1$ is large, this expression may be approximated by:

$$R_1 \approx (1/\omega_0 C)^2[1/\rho_{TD0}^2] \rightarrow (1/\omega_0 C_3)^2 \text{ as } R_1 \rightarrow \infty$$

Thus one may best detect larger intertrace resistances using low base frequencies.

We claim:

1. A method of testing an interconnection on a substrate comprising the acts of:
   providing a first charged particle beam and a second charged particle beam;
   modulating the first beam by a first frequency and the second beam by a second differing frequency;
   directing the first modulated beam onto a first location on a trace of the interconnection;
   directing the second modulated beam simultaneously with the first modulated beam onto a second location on the trace, the second location being different from the first location; and
   detecting resulting electrons emitted by the interconnection.

2. The method of claim 1 further comprising:
   frequency filtering the detected signal.

3. The method of claim 1 further comprising:
   processing the detected signal to obtain its direct impedance, transimpedance, direct impedance ratio, transimpedance ratio, low frequency trans/direct ratio, and high frequency trans/direct ratio;
   comparing a value of each of the ratios with a predetermined range of values for the ratio;
   selecting a ratio to calculate an electrical property based on the result of the comparing; and calculating the electrical property.

4. The method of claim 1 further comprising the acts of:
   sensing voltage decay on the trace to obtain a first ratio;
   calculating leakage resistance;
   measuring voltage buildup on a second trace adjacent to the trace to obtain a second ratio; and calculating resistance.

5. The method of claim 3 wherein the processing comprises filtering of the detected signal with filters tuned to the frequency of the first beam, a multiple of the frequency of the first beam, the frequency of the second beam, a multiple of the frequency of the second beam and the sum of the frequencies of the first beam and the second beam.

6. The method of claim 5 wherein the detecting includes detecting of phase shift.

7. The method of claim 5 further comprising the acts of selecting the first frequency and the second frequency for highest sensitivity to different trace defects.

8. The method of claim 3 further comprising the acts of obtaining the direct impedance ratio and the transimpedance impedance ratio from a signal detected simultaneously, the signal comprising component having the first frequency and the second frequency, the first frequency and the second frequency being different from each other.

9. The method of claim 3 further comprising the acts of obtaining the direct impedance ratio and the transimpedance ratio from signals detected at different times, the signals comprising component having the first frequency and the second frequency, the first frequency and the second frequency being different from each other.

10. The method of claim 3 further comprising the acts of obtaining the direct impedance ratio and the transimpedance ratio from signals from different test points detected at different times, the signals comprising component having the first frequency and the second frequency.

11. The method of claim 3 wherein the detected signal comprises an AC component and a DC component.

12. An apparatus for testing an interconnection on a substrate comprising:
   a source of a first charged particle beam modulated at a first frequency;
   a source of a second charged particle beam modulated at a second frequency different from the first frequency;
   a support for the substrate under test;
   a first charged particle optics associated with the first beam which directs the first beam onto a first test point on the interconnection;
   a second charged particle optics associated with the second beam which directs the second beam, simultaneously with the first beam directed by the first charged particle optics, onto a second test point on the interconnection, the second test point different from the first test point; and
   a detector for detecting electrons emitted from the substrate under test resulting from the first and the second beams.

13. The apparatus of claim 12 further comprising an enclosure surrounding at least the charged particle optics associated with the first and second beams, said enclosure comprising magnetically soft material.

14. The apparatus of claim 13, wherein the enclosure has a uniform magnetic field therein.

15. The apparatus of claim 12 further comprising a frequency selective signal processing circuit coupled to the detector.

16. The apparatus of claim 15 wherein the signal processing circuit includes a filter tuned to the frequency of the first beam, a filter tuned to the frequency of a multiple of the frequency of the first beam, a filter tuned to the frequency of the second beam, a filter tuned to the frequency of a multiple of the frequency of the second beam, a filter tuned to the frequency of the sum of the frequencies of the first beam and the second beam.

17. The apparatus of claim 15 further comprising a circuit to detect phase shift of each frequency.

18. The apparatus of claim 12 further comprising a control electrode located adjacent to the source of each beam.

19. The apparatus of claim 12 wherein the beam sources each include an electron gun.

20. The apparatus of claim 19 wherein the electron gun comprises a cathode, an anode, a control electrode and a suppressor electrode.

21. The apparatus of claim 12 wherein each of the charged particle optics include electrostatic structured lenses and octopole stigmation coils.

22. The apparatus of claim 12 further comprising deflection coils each associated with one of the beams, each deflection coil being selected from the group consisting of saddle deflection coils and toroid deflection coils.

23. The apparatus of claim 12 further comprising a solenoid excitation coil.

24. The apparatus of claim 15 wherein the signal processing circuit comprises a low pass filter for detecting DC signal.

25. The apparatus of claim 12 wherein the detector comprises a solid state diode.

26. An apparatus for creating a uniform lens field for distributed axis focusing in a device for testing an electrical interconnection, the apparatus comprising:
  a charged particle beam assembly for forming at least two charged particle beams at two different frequencies directed onto the interconnection;
  a charged particle optical assembly for focusing the beams from the charged particle beam assembly onto the interconnection;
  an enclosure surrounding at least the charged particle optical assembly and comprising magnetically soft material; and
  a solenoid excitation coil surrounding at least the charged particle optical assembly, thereby creating a substantially uniform axial magnetic field within the enclosure.

* * * * *